United States Patent [19]

Fayfield

[11] Patent Number: 4,965,548

[45] Date of Patent: Oct. 23, 1990

[54] LEVEL INDICATOR WITH ALARM

[75] Inventor: Robert W. Fayfield, Shorewood, Minn.

[73] Assignee: Banner Engineering Corp., Minneapolis, Minn.

[21] Appl. No.: 308,733

[22] Filed: Feb. 9, 1989

[51] Int. Cl.$^5$ .................... G08B 29/00; B60Q 1/00
[52] U.S. Cl. .................... 340/511; 340/518; 340/525; 340/691; 340/459; 340/461; 455/134
[58] Field of Search ............... 340/511, 525, 524, 539, 340/517, 518, 510, 519–522, 691, 459, 461, 462, 762, 766, 782, 811, 815.03; 455/134, 154, 158, 159; 362/800; 334/5, 86

[56] References Cited

U.S. PATENT DOCUMENTS

| | | |
|---|---|---|
| 3,487,263 | 12/1969 | Pahlavan . |
| 3,603,799 | 3/1969 | Nabusawa . |
| 3,740,562 | 6/1973 | Fertig . |
| 3,818,495 | 6/1974 | Sagara et al. . |
| 3,898,636 | 8/1975 | Smith . |
| 3,967,281 | 6/1976 | Dageford ........................ 340/520 |
| 3,999,126 | 12/1976 | Gabor .......................... 340/525 |
| 4,023,910 | 5/1977 | Niederhauser et al. . |
| 4,043,676 | 8/1977 | Holzinger et al. . |
| 4,043,677 | 8/1977 | Toyoda . |
| 4,176,955 | 12/1979 | Yamada et al. . |
| 4,251,769 | 2/1981 | Ewert et al. ..................... 324/96 |
| 4,356,393 | 10/1982 | Fayfield . |
| 4,399,352 | 8/1983 | Ueda ........................ 219/506 |
| 4,401,386 | 8/1983 | Yuasa et al. . |
| 4,644,341 | 2/1987 | Warner . |
| 4,649,387 | 3/1987 | Maris ........................... 340/525 |
| 4,694,155 | 9/1987 | Bletz et al. . |
| 4,709,197 | 11/1987 | Goldhammer et al. ............ 340/525 |

FOREIGN PATENT DOCUMENTS 3304566 1/1984 Fed. Rep. of Germany .
1299185 12/1972 United Kingdom .

OTHER PUBLICATIONS

Accraply; 8000 Series Label Sensor Sensitivity Set-Up Procedure, 2-9-89.

Primary Examiner—Donnie L. Crosland
Attorney, Agent, or Firm—Merchant, Gould, Smith, Edell, Welter & Schmidt

[57] ABSTRACT

An LED bar graph display is disclosed, which can simultaneously display signal strength and diagnostic information. When an input signal is received, the indicators are selectively operated to display a strength value of the input signal. When a diagnostic condition occurs, the indicators are selectively operated to display the diagnostic condition. Thus, the LED bar graph display performs the dual functions of displaying signal strength and diagnostic information.

24 Claims, 1 Drawing Sheet

LEVEL INDICATOR WITH ALARM

TECHNICAL FIELD OF THE INVENTION

The present invention relates generally to level or signal strength indicators, which are particularly useful in the field of sensors or scanners. More specifically, the present invention relates to a signal strength indicator that can also be used for diagnostic indication.

BACKGROUND OF THE PRIOR ART

Although the present invention can be used in a variety of applications in many different fields, the preferred embodiment is used in the field of sensors or scanners. In the field of sensors or scanners, certain prior art devices have indicators that display a measure of signal strength. Such displays are useful as an aid in correctly aligning the sensor or scanner. For example, in the field of photoelectric sensors, various techniques are used in displaying the strength of the received light signal, such as a variable frequency flashing indicator or a LED bar graph display.

The trend toward miniaturization of sensor and scanner devices has created problems in their electrical design. Miniaturization requires smaller, or alternatively, fewer, electronic components. Miniaturization also complicates the tasks of power supply and heat dissipation because power for low voltage DC circuits often requires the conversion of 120 volt AC. Thus, in miniaturized sensors or scanners, providing both a signal strength indicator and a separate diagnostic indicator in the sensor or scanner would conflict with the need for minimizing the size of the circuit, the power required by the circuit, the amount of heat generated, the number of components used, and the cost.

SUMMARY OF THE INVENTION

The present invention overcomes these problems in the prior art by providing a dual function display. In the preferred embodiment, the present invention causes a LED bar graph display to perform the dual functions of signal strength display and diagnostic display. This dual function device does not require a significantly larger device that is more costly, uses more power, and generates more heat. The Applicant's invention provides means for detecting and displaying diagnostic operating conditions within the sensor or scanner, as well as providing means for displaying signal strength. Environmental conditions such as the presence of moisture, temperature within the sensor, output load conditions, and signal contrast are monitored by the Applicant's invention. Diagnostic indications are displayed in the event that any of these monitored conditions exceed predetermined limits.

DETAILED DESCRIPTION OF THE PREFERRED EMBODIMENT

Figure 1:
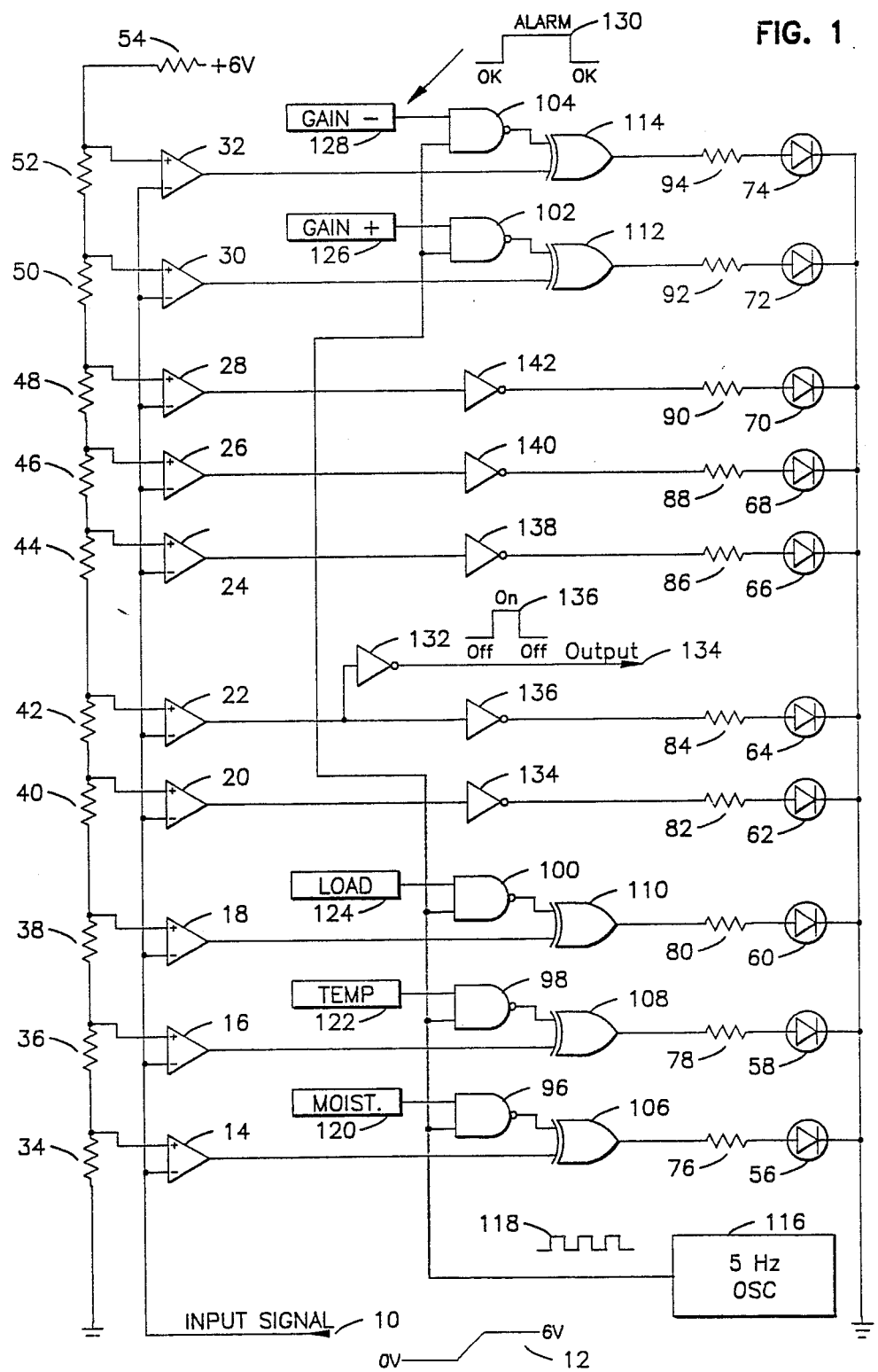
FIG. 1 is a schematic of the preferred embodiment of the present invention.

In the following Detailed Description of the Preferred Embodiment, reference is made to the accompanying Drawing which forms a part hereof, and in which is shown by way of illustration a specific embodiment in which the invention may be practiced. It is to be understood that other embodiments may be utilized and structural changes may be made without departing from the scope of the present invention.

The preferred embodiment of the present invention uses an array of LEDs to display a bar graph for signal strength indication. Individual LEDs can also flash if there is a diagnostic condition. Thus, the LEDs perform "double duty" for both signal strength indication and diagnostic indication. The present invention reduces the area required for information display. In addition, the present invention lessens the amount of power required because only one set of LEDs are used to display information.

The preferred embodiment of the present invention is a simple A/D ten level converter, that drives a bar graph indicator consisting of ten LEDs. The circuit and LED bar graph together serve as a complete diagnostic system when installed in the sensor. As the analog input voltage varies from zero to several volts, the LED bar graph grows and shrinks in length, similar to a VU display on a tape deck. If any diagnostic conditions exist, one or more of the LEDs in the bar graph flash at a frequency of approximately five hertz. The preferred embodiment monitors the following diagnostic conditions: (1) the temperature inside the sensor (by thermistor); (2) condensation or moisture inside the sensor (by impedance); (3) overload of the output transistors; (4) not enough gain; (5) too much gain.

In FIG. 1, a separate sensing means (not shown) generates an analog input signal 10. The diagram 12 illustrates the analog nature of the signal 10 as its strength varies between zero and six volts. One possible embodiment of the sensing means would be a modulated LED photoelectric control that provides an output voltage of zero volts when receiving no light and an output voltage of six volts when receiving maximum light. The photoelectric control would provide a range of voltages between these limits, said voltage proportional to the strength of the received signal. The input signal 10 is applied to the inverting inputs of ten comparators 14–32. The non-inverting input of each comparator is connected to a voltage divider circuit made up of resistors 34–54. The voltage divider circuit provides the voltage thresholds for each comparator 14–32 (the threshold for comparator 14 is 0.25 volts; the threshold for comparator 16 is 0.35 volts; the threshold for comparator 18 is 0.5 volts; the threshold for comparator 20 is 0.7 volts; the threshold for comparator 22 is 1.0 volts; the threshold for comparator 24 is 1.3 volts; the threshold for comparator 26 is 1.7 volts; the threshold for comparator 28 is 2.2 volts; the threshold for comparator 30 is 2.9 volts; the threshold for comparator 32 is 3.7 volts). Thus, the output of each comparator 14–32 is high if the input signal 10 is less than the threshold of the comparator 14–32. The output of each comparator 14–32 is low if the input signal 10 is greater than the threshold of the comparator 14–32. This type of circuit is well known to known those skilled in the art, and is available as a standard integrated circuit from many sources (type LM3914 from National Semiconductor Corporation, for example).

In a conventional use of such an integrated circuit, the outputs of the comparators 14–32 would typically drive the ten LED indicators 56–74 so that the LEDs 56–74 form a bar graph display. The higher the voltage of the input signal 10, the more LEDs 56–74 are lit. The circuit of the preferred embodiment, however, interposes a series of gates 96–114 between the outputs from the comparators 14–32 and the LEDs 56–74. These gates 96-114 permit the same LEDs to act as indicators of various diagnostic conditions at the same time the LEDs are indicating the strength of the input signal 10.

The boxes marked "Moist" 120, "Temp" 122, "Load" 124, "Gain+" 126, and "Gain−" 128 represent external circuitry which monitor the environmental parameters of moisture, temperature, load current, and gain settings of the sensing means. For example, when an environmental parameter is within normal limits, the output of circuit "Gain−" 128 is "low" (described as "ok" in the diagram 130). When the environmental parameter is outside some predetermined limits, the output of circuit "Gain−" 128 is "high" (described as "alarm" in the diagram 130).

A five hertz oscillator 116 generates a square wave as one input for each NAND gate 96-104. The square wave is described by diagram 118. If the other input for the NAND gate 96-104 is held low (i.e., an "ok" signal), then the NAND gate 96-104 output remains high regardless of the state of the square wave. The output from the NAND gate 96-104 provides the input for the EXCLUSIVE OR (XOR) gate 106-114. The output from the comparators 14-32 provides the other input for the XOR gates 106-114. The output from an XOR gate is high only if the two inputs to the XOR gate differ (one low and one high). Thus, in the preferred embodiment, it can be seen that if the output of a NAND gate 96-104 is low, then the output of the associated XOR gate 106-114 follows the action of the associated comparator 14-32, but inverts the logic level.

As an illustration, if the input signal 10 is 0 volts, then the output of comparator 14 is high, the output of NAND gate 96 is high (assuming the moisture sensor "Moist" 120 signals "ok"), the output of XOR gate 106 is low, and LED 56 is off. If the input signal 10 exceeds 0.25 volts, then the output of comparator 14 is low, the XOR gate 106 output is high, and LED 56 is on. This is the normal operation of a bar graph display.

However, if moisture is detected, then the output of the moisture detector "Moist" 120 goes high. Now, NAND gate 96 is satisfied (both inputs high) half of the time, when the oscillator 116 output is high, and NAND gate 96 in turn causes the XOR gate 106 output to switch between high and low at a frequency of five hertz. An observer would see a flashing LED 56. Note that LED 56 will flash even if the output of comparator 14 is high, since the output of NAND gate 96 is alternating between high and low, causing XOR gate 106 to be satisfied half of the time. The result is that any "alarm" signal causes the associated LED 56-74 to flash regardless of the steady state of the LED 56-74, due to the input signal 10.

Resistors 76-94 establish the current in the LEDs 56-74. Inverter 132 inverts the output of comparator 22, and provides a logic level output signal 134 to an output means (not shown) such that an external load can be operated when the input signal 10 exceeds the threshold of 1.0 volts for the fifth comparator 22. Inverters 134-142 invert the outputs of comparators 20-28, respectively, such that the LEDs 62-70 can be operated when the input signal 10 exceeds the thresholds of comparators 20-28.

An additional enhancement could logically "OR" the outputs of the individual parameter sensors 120-128, such that if any diagnostic condition occurs, then a second logic level output signal would operate a second output means. It is envisioned that the second output signal could operate a light, bell, or other alerting means.

Although a specific embodiment has been illustrated and described herein, it will be appreciated by those of ordinary skill in the art that any arrangement which is calculated to achieve the same purpose may be substituted for the specific embodiment shown. For example, the input signal 10 could be generated by sensing means including, but not limited to, photoelectric sensors, capacitance proximity sensors, ultrasonic presence sensors, inductive proximity sensors, temperature or pressure sensors, or any other sensor whose output can be presented in the form of an analog voltage, and for which an analog indication of signal strength is desired along with the ability to indicate "alarm" or "alert" conditions. In addition, the indicating means is not limited to LEDs 56-74, but could equally well be incandescent lamps, liquid crystal displays, or other indicating means. Also, the flashing of an LED in the "alarm" state is not the only way of indicating the diagnostic condition. In an alternative embodiment, for example, each LED 56-74 could be a "bicolor" LED, such that when the alarm condition occurs the LED changes from green to red. In this case, the "double duty" concept of the present invention still exists. This application is intended to cover any adaptations or variations of the present invention. Therefore, it is manifestly intended that this invention be limited only by the claims, and the equivalents thereof.

What is claimed is:

1. An apparatus for displaying signal strength indications and diagnostic conditions, comprising:
   (a) a plurality of indicators;
   (b) means for sensing the signal strength indication;
   (c) means for selectively operating said indicators to display the signal strength indication;
   (d) means for sensing the diagnostic condition; and
   (e) means for selectively operating at least one of said indicators to display both the signal strength indication and the diagnostic condition.

2. The apparatus of claim 1, wherein each of said indicators is a light emitting diode.

3. The apparatus of claim 1, wherein each of said indicators indicate one of said diagnostic conditions.

4. The apparatus of claim 1, wherein said diagnostic condition comprises a temperature value.

5. The apparatus of claim 1, wherein said diagnostic condition comprises a condensation condition.

6. The apparatus of claim 1, wherein said diagnostic condition comprises a signal contrast value.

7. The apparatus of claim 6, wherein said signal contrast value indicates not enough gain.

8. The apparatus of claim 6, wherein said signal contrast value indicates too much gain.

9. A method of displaying signal strength indication and diagnostic conditions on a plurality of indicators, comprising:
   (a) sensing the signal strength indication;
   (b) selectively operating the indicators to display the signal strength indication;
   (c) sensing the diagnostic condition; and
   (d) selectively operating at least one of said indicators to display both the signal strength indication and the diagnostic condition.

10. The method of claim 9, wherein each of said indicators is a light emitting diode.

11. The method of claim 9, wherein each of said indicators indicate one of said diagnostic conditions.

12. The method of claim 9, wherein said diagnostic condition comprises a temperature value.

13. The method of claim 9, wherein said diagnostic condition comprises a condensation condition.

14. The method of claim 9, wherein said diagnostic condition comprises a signal contrast value.

15. The method of claim 14, wherein said signal contrast value indicates not enough gain.

16. The method of claim 14, wherein said signal contrast value indicates too much gain.

17. An apparatus for displaying signal strength indications and diagnostic conditions, comprising:
 (a) a plurality of indicators;
 (b) control means operatively connected to said indicators for:
  (1) sensing the signal strength indication;
  (2) selectively operating said indicators to display the signal strength indication;
  (3) sensing the diagnostic condition; and
  (4) selectively operating said indicators to display both the signal strength indication and the diagnostic condition.

18. The apparatus of claim 17, wherein each of said indicators is a light emitting diode.

19. The apparatus of claim 17, wherein each of said indicators indicate one of said diagnostic conditions.

20. The apparatus of claim 19, wherein said diagnostic condition comprises a temperature value.

21. The apparatus of claim 19, wherein said diagnostic condition comprises a condensation condition.

22. The apparatus of claim 19, wherein said diagnostic condition comprises a signal contrast value.

23. The apparatus of claim 22, wherein said signal contrast value indicates not enough gain.

24. The apparatus of claim 22, wherein said signal contrast value indicates too much gain.

* * * * *